United States Patent [19]
Kang et al.

[11] Patent Number: 6,071,373
[45] Date of Patent: Jun. 6, 2000

[54] CHEMICAL BATH HAVING A UNIFORM ETCHANT OVERFLOW

[75] Inventors: Jung-ho Kang; Kwang-yul Lee; Dong-cho Maeng, all of Kyounggi-do; Jong-sub Hwang, Kyunggi-do, all of Rep. of Korea

[73] Assignee: Samsung Electronics Co., Ltd., Suwon, Rep. of Korea

[21] Appl. No.: 08/870,238

[22] Filed: Jun. 5, 1997

[30] Foreign Application Priority Data

Jun. 5, 1996 [KR] Rep. of Korea ............... 96-19976

[51] Int. Cl.[7] ............................................... C23F 1/02
[52] U.S. Cl. ............................................................. 156/345
[58] Field of Search ........................ 156/345; 438/745, 438/747; 216/86, 90; 118/400, 412

[56] References Cited

U.S. PATENT DOCUMENTS

| | | | |
|---|---|---|---|
| 3,411,999 | 11/1968 | Weinberg | 216/90 |
| 3,699,785 | 10/1972 | Waugh | 68/17 A |
| 3,863,467 | 2/1975 | Pielemeier et al. | 68/18 F |
| 3,869,313 | 3/1975 | Jones et al. | 156/345 |
| 4,350,553 | 9/1982 | Mendes | 156/345 |
| 4,557,785 | 12/1985 | Ohkuma | 156/345 |
| 4,578,137 | 3/1986 | Kring | 156/345 |
| 5,089,084 | 2/1992 | Chhabra et al. | 156/345 |
| 5,364,494 | 11/1994 | Hutchison et al. | 156/345 |
| 5,374,325 | 12/1994 | Cannizzaro, Jr. | 438/747 |
| 5,407,869 | 4/1995 | Holloway et al. | 438/745 |
| 5,500,081 | 3/1996 | Bergman | 438/706 |
| 5,591,139 | 1/1997 | Lin et al. | 604/264 |
| 5,695,661 | 12/1997 | Rasmussen et al. | 438/756 |

*Primary Examiner*—Benjamin L. Utech
*Assistant Examiner*—Duy-Vu Deo
*Attorney, Agent, or Firm*—Jones Volentine, L.L.P.

[57] ABSTRACT

A chemical bath of an overflow-type includes an inner bath which includes a plurality of holes on its sidewalls. The holes are formed in such a manner that they are spaced apart from the upper end of the inner bath at a predetermined distance. In this chemical bath, the chemical in the inner bath flows over the upper end of the inner bath into the outer bath and is simultaneously is discharged to the outer bath through the holes. Accordingly, unless either of the opposed sidewalls slopes lower than another by over a predetermined value, the chemical can flow continuously at nearly the same rate at both sidewalls of the inner bath. This reduces the difference of the etching rate between the respective wafers caused by the difference of the position of the wafers immersed in the chemical in the inner bath and leads to an improvement in the reliability of the etching process.

13 Claims, 1 Drawing Sheet

CHEMICAL BATH HAVING A UNIFORM ETCHANT OVERFLOW

BACKGROUND OF THE INVENTION

The present invention relates generally to an overflow-type chemical bath in which an inner bath contains a plurality of holes on its upper sidewall. In this chemical bath, the wet chemical flows over the upper end of each sidewall of the inner bath while passing through the holes at the same time, which reduces the difference of the etching rate between the respective wafers.

In the manufacturing process of semiconductor devices, etching can be performed through two methods: one is wet etching using wet chemical; another is dry etching using gas. Immersion etching and spray etching are included in the former, and plasma etching, ion beam etching and reactive ion etching are included in the latter.

In immersion etching, when the wafers on which insulating layers are deposited are immersed in wet chemical etchant in an inner bath, the insulating layers are etched to the predetermined depth. In this case, the wet chemical etchant is continuously supplied to the inner bath by a circulation system and hence overflows the upper end of each sidewall of the inner bath.

One problem with this method is that etching residue can remain floating around the top surface of the wet chemical etchant. This residue can impair the etching process by reducing the etching speed for the wafer, thus causing different wafers in the same chemical pool to etch at different rates. The overflowing of the wet chemical etchant is meant to flush out this residue, but it is not uniformly successful.

FIG. 1 shows a scheme of a conventional overflow-type chemical bath 10. This chemical bath 10 includes a rectangular-shaped inner bath 11 contained within a rectangular-shaped outer bath 17, the inner bath holding a wet chemical 15. A supply tube 13 is connected to the inner bath, and a discharge tube is connected to the outer bath. A pair of horizontal balance adjusting units 18 are attached to the outside of the outer bath 17. A plurality of robot chucks 23 are provided each for holding one of a plurality of wafers 21 and dipping the wafer 21 into the inner bath for etching. Each of these wafers has a deposition layer that needs to be etched.

The wet chemical 15 is preferably a wet chemical etchant such as hydrogen fluoride (HF), or the like.

With reference to this figure, the wet chemical 15 is supplied into the inner bath 11 through a supply tube 13 connected to the bottom of the inner bath 11. The wet chemical 15 is supplied continuously to the inner bath 11 so that it flows over the upper end of each sidewall of the inner bath 11. The overflowing wet chemical 15 flows into the outer bath 17 and is discharged through the discharge tube 19 connected to the bottom of the outer bath. The discharged wet chemical 15 is then resupplied into the inner bath 11 after passing through a pump and a filter, which are not shown in this figure.

In this conventional chemical bath 10, a pair of horizontal balance adjusting units 18 are provided at either side of the outer bath 17 to horizontally balance the entire mechanism.

The operation of a conventional chemical bath 10 is described below.

The wet chemical 15 is continuously supplied into the rectangular-shaped inner bath 11 of the chemical bath 10 through the supply tube 13 to an uniform amount of about 10 to 12 liters/min. The wet chemical 15 flows over the upper end of each sidewall of the inner bath 11 into the outer bath 17 and is discharged through the discharge tube 19. The discharged wet chemical 15 is then resupplied to the inner bath 11 via the supply tube 13 of after passing through a pump and filter, which are not shown.

As the wet chemical 15 is continually supplied to the inner bath 11, the plurality of robot chucks 23 each hold onto one of the plurality of wafers 21. The robot chucks then lower the wafers 21 into the chemical etchant 15 in the inner bath 11, which causes the deposition layers on the wafers 21 to be etched.

The etching continues for a predetermined time until the layer has been etched to a predetermined depth. Once the predetermined depth is obtained, the robot chucks 23 rise, the wafers 21 emerge from the wet chemical 15, and the etching process stops.

Next, the wafers 21 held by the robot chucks 23 are washed using deionized water in a typical washing process. This completes the etching of the wafers 21.

In this process, however, it is nearly impossible to maintain the horizontal balance of the inner bath 11. As a result, if, for example, the right-positioned sidewall of the inner bath 11 slopes lightly lower than the left-positioned sidewall, the amount of the wet chemical 15 flowing over the upper end of the right sidewall of the inner bath 11 may be larger than that flowing over the upper end of the left sidewall. Likewise, if the left-positioned sidewall slopes lower than the right-positioned sidewall, the wet chemical 15 flowing over the upper end of the left sidewall of the inner bath 11 may be larger than that flowing over the upper end of the right sidewall.

This difference in flow rates over the sidewalls of the inner bath 11 becomes particularly important when you consider the role of the overflow in eliminating etching residue. If one side overflows at a quicker pace than another, wafers 21 closer to that side will have less etching residue interfering with etching and will thus have a greater etch rate. The difference of the etching rate between wafers 21 is undesirable.

Therefore, unless an accurate horizontal balance of the inner bath 11 is maintained, the amount of the overflowing wet chemical 15 may differ at the various sides of the inner bath 11. This makes it difficult to obtain a uniform etching rate for the entire plurality of wafers 21 and diminishes the reliability of the etching process.

Accordingly, in this conventional chemical bath 10, a worker must continually check whether the inner bath is horizontally balanced using a leveling instrument during the etching process. If the chemical bath 10 is not balanced, the worker must adjusting the horizontal balance adjusting units 18, generally using screws or the like, to maintain the horizontal balance of the inner bath 11.

SUMMARY OF THE INVENTION

In view of the above, it is an object of the present invention to provide a chemical bath in which an inner bath comprises on its sidewalls to reduce the difference of the etching rate between the respective wafers caused by the difference of the position of the wafers immersed in the chemical in the inner bath, thus improving of the reliability of the etching process.

To obtain this object, according to the present invention, there is provided a chemical bath comprising: an outer bath; an inner bath, placed within the outer bath; and a supply mechanism for supplying a wet chemical to the inner bath, wherein the inner bath comprises sidewalls and the sidewalls of the inner bath comprise a plurality of holes for passing the wet chemical from the inner bath into the outer bath.

The chemical bath may further comprise a discharge mechanism connected to the outer bath for discharging the wet chemical. The supply mechanism may be a supply hose, and the discharge mechanism may be a discharge tube.

The plurality of holes may be formed identically on opposite sidewalls of the inner bath. The plurality of holes may also be formed on the sidewalls of the inner bath between an upper edge of the sidewalls of the inner bath and a position corresponding to the top of wafers fully immersed for chemical processing in the chemical in the inner bath. Specifically, the plurality of holes may be formed within 2 cm from the upper edge of the sidewalls of the inner bath. More specifically, the plurality of holes are formed within 1 cm from the upper edge of the sidewalls of the inner bath.

The plurality of holes may each be circular in shape, having a diameter between 3 to 5 mm, or specifically about 4 mm.

The wet chemical may be a wet chemical etchant, such as hydrogen fluoride, or deionized water.

DETAILED DESCRIPTION OF THE PREFERRED EMBODIMENTS

A chemical bath according to a preferred embodiment of the present invention is described below with reference to the appended drawings.

Figure 1:
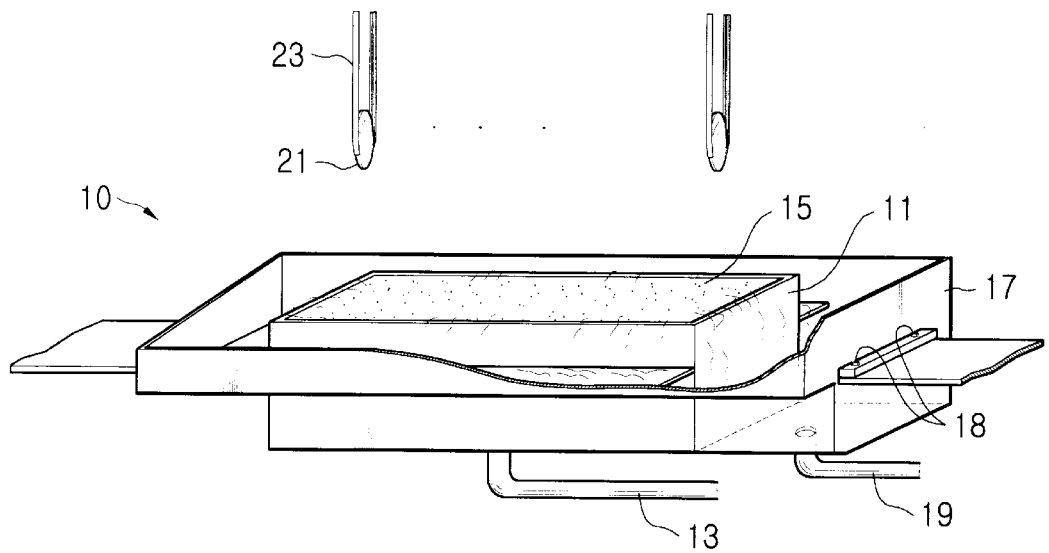
FIG. 1 is a schematic drawing of a conventional overflow-type chemical bath.
Figure 2:
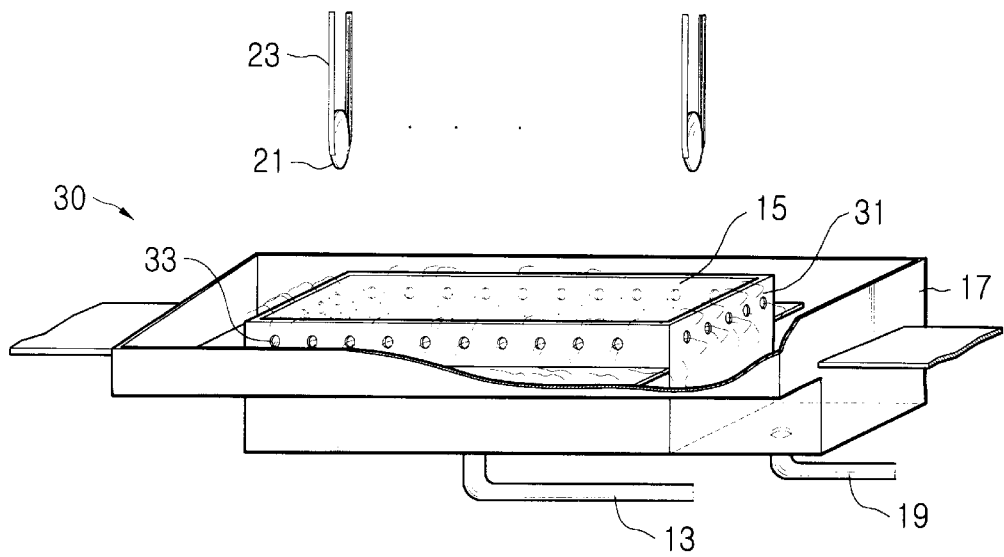
FIG. 2 is a schematic drawing of a chemical bath according to a preferred embodiment of the present invention.

FIG. 2 is a schematic drawing of a chemical bath 30 according to a preferred embodiment of the present invention. In this schematic drawing, parts similar to those previously described with reference to FIG. 1 are denoted by the same reference numerals to simplify the description.

As shown in FIG. 2, the chemical bath 30 includes a rectangular-shaped inner bath 31 contained within a rectangular-shaped outer bath 17, the inner bath holding a wet chemical 15. The inner bath 31 includes a plurality of holes 33 formed on its sidewalls. A supply tube 13 is connected to the inner bath, and a discharge tube is connected to the outer bath. A plurality of robot chucks 23 are provided each for holding one of a plurality of wafers 21 and dipping the wafer 21 into the inner bath for etching. Each of these wafers has a deposition layer that needs to be etched. The structure of the chemical bath 30 according to a preferred embodiment of the present invention is similar to that of FIG. 1, except that no horizontal adjusting unit is needed, and holes 33 are formed on opposite sidewalls of the inner bath 31.

The wet chemical 15 used in the chemical bath is preferably a wet chemical etchant, such as hydrogen fluoride (HF) or the like.

The plurality of the holes 33 are preferably formed on the sidewalls of the inner bath 31 at regular intervals. They are formed on opposite sidewalls, preferably in a mirror relationship.

The holes 33 are preferably positioned between the upper parts of the wafers 21 that are immersed in the wet chemical 15 in the inner bath 31 during etching and the upper end of the inner bath 31. The holes 33 are preferably positioned so that they are higher than the upper part of the wafers 21 at the point that they are fully immersed in the wet chemical 15 in the inner bath 31.

In the inner bath 31 of the preferred embodiment, the distance between the upper part of the wafers 21, when fully immersed, and the upper end of the inner bath 31 is about 2 cm. The holes 33 in the preferred embodiment may thus be formed at any points within 2 cm from the upper end of the inner bath 31. This distance may change as the parameters of the chemical bath 30 change, getting bigger or smaller depending upon the size of the inner bath 31, the depth of wet chemical 15 in the inner bath 31, and the depth to which the wafers 21 are immersed in the wet chemical 15.

The holes 33 are preferably formed having a similar predetermined shape. In the preferred embodiment, the holes are round and have a diameter of preferably 3 to 5 mm, most preferably 4 mm. In the preferred embodiment, the total number of holes 33 is 125. The number, shape, and size of the holes 33 can vary depending upon a variety of factors including the amount of chemical etchant 15 flowing through the inner bath 31.

The operation of the chemical bath 30 is described below.

The wet chemical 15 is supplied continuously into the rectangular-shaped inner bath 31 through the supply tube 13. Preferably the wet chemical is supplied to an uniform amount of 10 to 13 liters/min, most preferably 12 liters/min. The supplied wet chemical 15 flows over the upper end of each sidewall of the inner bath 31 and through the holes 33 into the outer bath 17. The wet chemical 15 is then is discharged from the outer bath 17 through the discharge tube 19. The discharged wet chemical 15 is then resupplied to the supply tube 13 and thus to the inner bath 31 after passing through a pump and filter, which are not shown.

As the wet chemical 15 is continually supplied to the inner bath 31, the plurality of robot chucks 23 each hold onto one of the plurality of wafers 21. The robot chucks 23 then lower the wafers 21 into the wet chemical 15 in the inner bath 31, which causes the deposition layers on the wafers 21 to be etched.

As with the conventional chemical bath, the etching continues for a predetermined time until the layer has been etched to a predetermined depth. Once the predetermined depth is obtained, the robot chucks 23 rise, the wafers 21 emerge from the chemical etchant 15, and the etching process stops. Then, the wafers 21 held by the robot chucks 23 are washed using deionized water in a typical washing process to complete the etching of the wafers 21.

During etching in the chemical bath 30, however, if the right-positioned sidewall of the inner bath 31 slopes lightly lower than the left-positioned sidewall, the wet chemical 15 in the inner bath 31 flows over the upper end of the right sidewall and through the holes 33 formed at both sidewalls of the inner bath 31. Thus, although the wet chemical 15 in this case does not flow over the upper end of the left sidewall, it is nevertheless discharged from both the right and left side simultaneously into the outer bath 17

By discharging wet chemical 15 from both sides of the inner bath, the chemical bath 30 insures that etching refuse will be better cleared from both sides of the inner bath 31. Since there will be a more uniform elimination of etching refuse on all sides of the inner bath, the etching speed will remain more constant throughout the bath and individual wafers 21 positioned at different places in the inner bath 31 will be etched at a more constant rate.

As long as the slope of the right-positioned sidewall of the inner bath 31 is not so great as to put the upper part of the right-positioned sidewall below the holes 33 on the left-positioned sidewall, the chemical etchant 15 in the inner bath 31 will be fed into to the outer bath 17 simultaneously on both sides, either through the holes 33 formed at both sidewalls of the inner bath 31 or over the right-positioned sidewall itself. In this case, even if the amount of the chemical flowing over the right-positioned sidewall is larger than the amount flowing through the holes 33 on the left-positioned sidewall, this difference is considerably reduced in comparison with that in the conventional inner bath 11 of FIG. 1.

However, if the right-positioned sidewall slopes lower than the left-positioned sidewall by such a degree that the top of the right-positioned sidewall is below the holes 33 on the left-positioned side, the chemical etchant 15 in the inner bath 31 will flow over the upper end of the right sidewall and passes through the holes 33 formed at the right sidewall at the same time, but will not pass through the holes 33 formed at the left sidewall. In this case, the amount of the flowing chemical becomes very different between the right sidewall and the left sidewall of the inner bath 31. In this position, the chemical bath 30 suffers the same problems as the conventional chemical bath 10 shown in FIG. 1.

As can be clearly seen based on this, the allowable slope of the inner bath depends upon the placement of the holes 33. The lower the holes are set in the inner bath, the greater the allowable slope. However, the holes cannot be placed so low as to cause the wafers to not be fully immersed in the wet chemical when the inner bath is sloped.

Consequently, unless either of two sidewalls slopes to be lower than another by over a predetermined distance, the difference of the amount of the flowing chemical at both sidewalls of the inner bath is remarkably reduced compared with the prior art, whereby the difference of the etching rate between the respective wafers is also reduced.

In the above discussion, the preferred embodiment was described for the condition when the right-positioned sidewall was lower than the left-positioned sidewall. Obviously, the reverse applies as well if the left were lower than the right. Furthermore, the invention is not limited to embodiments having holes 33 on only two sides of the inner bath 31. Holes 33 can be on all four sides of the inner bath 31 to account for unbalancing of the inner bath 31 in different directions. Similarly, the shape of the inner bath 31 need not be rectangular, but could be circular, or any other geometric shape. If the shape of the inner bath 31 is other than rectangular, the holes 33 should be placed opposite each other in any direction of likely unbalance of the inner bath 31.

As described above, the plurality of holes 33 are formed at any point on the sidewalls of the inner bath, the points being spaced apart from the upper end of the inner bath by a predetermined distance. Accordingly, as it is continuously supplied into the inner bath, the wet chemical 15 flows over the sidewalls of the inner bath 31 and simultaneously passes through the holes 33 into the outer bath 17. In this way, the difference of the amount of the chemical flowing into the outer bath 17 at opposite sides of the inner bath 31 is considerably reduced compared with a conventional chemical bath unless either of both upper ends inclines to be lower than a predetermined distance.

Furthermore, the difference of the etching rate between respective wafers 21 in the chemical bath 30 is remarkably reduced by this improved wet chemical flow and so the reliability of the etching process is enhanced.

In addition, although the described preferred embodiment discloses a chemical bath applied to an etching process, it is not limited to such an application. A similar structure for a chemical bath may be used for a washing process by simply using deionized water as the wet chemical 15 instead of a wet chemical etchant.

The present invention is not limited to the above-described embodiments. Various changes and modifications may be effected by one having an ordinary skill in the art and remain within the scope of the invention, as defined by the appended claims.

What is claimed is:

1. A dual-chambered bath comprising:

an outer bath;

an inner bath, placed within the outer bath, for receiving wafers;

a supply mechanism for supplying a wet chemical to the inner bath, wherein the inner bath comprises sidewalls, and wherein the sidewalls of the inner bath comprise a plurality of holes for passing the wet chemical from the inner bath to the outer bath, wherein the plurality of holes are formed on the sidewalls of the inner bath only at positions between an upper edge of the sidewalls of the inner bath and a position corresponding to the top of the wafers when the wafers are fully immersed for chemical processing in the chemical in the inner bath.

2. A chemical bath as recited in claim 1, wherein the supply mechanism is a supply tube.

3. A chemical bath as recited in claim 1, further comprising a discharge mechanism connected to the outer bath for discharging the wet chemical.

4. A chemical bath as recited in claim 3, wherein the discharge mechanism is a discharge tube.

5. A chemical bath as recited in claim 1, wherein the plurality of holes are formed identically on opposite sidewalls of the inner bath.

6. A chemical bath as recited in claim 1, wherein the plurality of holes are formed within 2 cm from the upper edge of the sidewalls of the inner bath.

7. A chemical bath as recited in claim 1, wherein the plurality of holes are formed within 1 cm from the upper edge of the sidewalls of the inner bath.

8. A chemical bath as recited in claim 1, wherein the plurality of holes are each circular in shape.

9. A chemical bath as recited in claim 8, wherein the plurality of holes each have a diameter between 3 to 5 mm.

10. A chemical bath as recited in claim 9, wherein the plurality of holes each have a diameter of about 4 mm.

11. A chemical bath as recited in claim 1, wherein the wet chemical is a wet chemical etchant.

12. A chemical bath as recited in claim 11, wherein the wet chemical is hydrogen fluoride.

13. A chemical bath as recited in claim 1, wherein the wet chemical is a deionized water.

* * * * *